(12) United States Patent
Hedler et al.

(10) Patent No.: US 7,080,988 B2
(45) Date of Patent: Jul. 25, 2006

(54) FLEXIBLE CONTACT-CONNECTION DEVICE

(75) Inventors: Harry Hedler, Germering (DE);
Roland Irsigler, Munich (DE);
Thorsten Meyer, Regensburg (DE);
Andreas Wolter, Pliening (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/137,061

(22) Filed: May 25, 2005

(65) Prior Publication Data

US 2005/0282410 A1 Dec. 22, 2005

(30) Foreign Application Priority Data

Jun. 22, 2004 (DE) .................... 10 2004 030 140

(51) Int. Cl.
*H01R 12/00* (2006.01)
*H05K 1/00* (2006.01)

(52) U.S. Cl. ........................... 439/66; 439/91; 439/591
(58) Field of Classification Search ................. 439/66, 439/91, 591; 361/773
See application file for complete search history.

(56) References Cited

U.S. PATENT DOCUMENTS

| | | | |
|---|---|---|---|
| 5,738,530 A * | 4/1998 | Schreiber et al. | 439/66 |
| 6,255,737 B1 | 7/2001 | Hashimoto | 257/784 |
| 6,313,532 B1 | 11/2001 | Shimoishizaka et al. | 257/734 |
| 6,396,145 B1 | 5/2002 | Nagai et al. | 257/737 |
| 6,948,940 B1 * | 9/2005 | Lindsey et al. | 439/66 |
| 2002/0089058 A1 * | 7/2002 | Hedler et al. | 257/737 |
| 2003/0067755 A1 | 4/2003 | Haimerl et al. | 361/773 |
| 2004/0175972 A1 * | 9/2004 | Kawai | 439/91 |

FOREIGN PATENT DOCUMENTS

JP   1005086 A2   5/2000

OTHER PUBLICATIONS

German Office Action dated Feb. 28, 2005.

* cited by examiner

*Primary Examiner*—Hae Moon Hyeon
(74) *Attorney, Agent, or Firm*—Jenkins, Wilson, Taylor & Hunt, P.A.

(57) ABSTRACT

The present invention relates to an elastic contact-connecting device. An elastic elevation 3 is applied to a carrier area 2 of a carrier 1. The elastic elevation 3 has a first oblique area 4, a second ramp 5 and a roof area 6. The first oblique area 4 has a lesser inclination (30) with regard to the carrier area 2 than the second oblique area 5. A contact region 20 is applied to the roof area 6 of the elastic elevation. The contact region 20 is connected to other structures 12 on the carrier 1 via a conductor track 10. For this purpose, the conductor track 10 is guided over the first oblique area 4. If a mating contact is pressed onto the contact region 20, the elastic elevation yields, but presses against the mating contact on account of its elastic property and thus enables a reliable contact. In this case, essentially only the second oblique area 5 is deformed; the first oblique area 4 and the conductor track 10 applied thereto are not subjected to any mechanical stress.

10 Claims, 5 Drawing Sheets

FLEXIBLE CONTACT-CONNECTION DEVICE

TECHNICAL FIELD

The present invention relates to a flexible contact-connection device.

BACKGROUND ART

Although applicable in principle to arbitrary contact-connections, the present invention and also the problem area on which it is based will be explained with regard to releasable contact-connections in test structures.

The integration density of semiconductor memory chips and of other semiconductor components is rising to an increasing extent. This leads to an increasing complexity of the methods for fabricating the memory elements, inter alia due to an increased number of individual processing steps, and also due to the reduction of the feature sizes. Test methods that can check whether a component has the desired functions as early on as possible in the fabrication method are of considerable interest for cost reasons. Before the individual components are sawn out from a wafer, their electrical properties and functions have already been completely defined. Therefore, this is an advantageous moment for contact-connecting the individual components and subjecting them to a test method corresponding to their function.

In order to test a component with regard to its functionality, it has to be connected to a suitable measuring apparatus. In a conventional method, for this purpose individual test tips are typically pressed onto electrical contacts of a component. For this purpose, the individual test tips have to be moved individually to the correct position with a high outlay.

A further test method provides for testing the individual components that have already been sawn but are still unpackaged. For this purpose, it is likewise necessary to provide suitable contact-connections which enable a simple yet nonetheless reliable contact-connection.

An expedient sensor that touches all the relevant contacts of a component and connects them to the measuring apparatus is pressed onto a component. Consequently, instead of a multiplicity of test tips, only one measuring sensor is moved over the wafer. Since the components on a wafer are typically all structurally identical, the one measuring sensor can be used for all the components. For this purpose, however, the measuring sensor must reliably connect each individual contact of an individual component to the measuring apparatus. Using elastic contacts on the part of the component and/or on the part of the measuring sensor ensures that all the connections are produced.

FIG. 5a shows a schematic illustration for elucidating the problem area of an elastic contact-connection such as is known inter alia from DE 100 16 132. This elastic contact-connection has an elastic elevation 3, on which a contact region 20 is applied to a roof area 6 that is planar to the greatest possible extent. The contact region is connected to structures 12 on the component via a conductor track 10. If a mating contact is pressed onto the contact region 20, the elastic elevation 3 yields. The elasticity of the elevation 3 ensures that the contact region 20 remains pressed against the mating contact. Unevennesses in a component are compensated for by the fact that the individual mechanical elevations 3 of different contact regions 20 are pressed together to different extents, so that all the individual contact regions 20 are connected to their corresponding mating contacts.

What is disadvantageous about this device is that the conductor track 10 is damaged with repeated compression of the elastic elevation 3. This is a consequence of compression of the conductor track 10. In this case, the conductor track 10 typically detaches from the elastic elevation 3, as illustrated in FIG. 5b. In this case, the conductor track 10 is locally compressed and/or buckled. Repeated compression of the conductor track 10 as a result of multiple contact-connection such as would occur in a test setup, for example, therefore leads to fatigue of a material of the conductor track 10 through to irreparable damage to the conductor track 10.

A further loading on the conductor track 10 is produced by that portion 40 of the elastic material which, on account of the pressed-together elevation, yields to the greatest possible extent uniformly on all sides, as indicated in FIG. 5b. The portions that bulge out beneath the conductor track 10 in this case lead to mechanical loading on the conductor track 10.

SUMMARY OF THE INVENTION

It is an object of the elastic contact-connection device according to the invention to enable a contact-connection which reacts less sensitively to the mechanical loading acting on the conductor track.

According to the invention, this object is achieved by means of the contact-connection device specified in claim 1.

The method according to the invention achieves a higher reliability of a contact-connection of components. This applies to the case of both single and repeated contact-connection.

An elastic elevation of the contact-connection device according to the invention is constructed asymmetrically. A first oblique area has a lesser inclination with regard to a carrier area than a second oblique area. If a force is exerted on a roof area of the elastic elevation, as in the case of a contact-connection, it is evident that the transverse forces that act perpendicularly on the second oblique area are greater than the transverse forces that act perpendicularly on the first oblique area. The consequence is that predominantly the second oblique area bulges out if a force presses onto the roof area of the elastic elevation, and, by contrast, the first oblique area essentially maintains its form. A contact region is applied to the roof area. The contact region on the roof area is connected to structures on the carrier by conductor tracks; in this case, the conductor track is guided over the first oblique area. In this case, it is advantageous that no mechanical transverse forces act on the conductor track due to the dimensionally stable first oblique area. A further advantage is that if a force presses onto the contact region, the compression forces acting on the conductor track are distributed over a greater length of the conductor track, and the material of the conductor track is thus loaded to a lesser extent per section of length.

Advantageous developments and refinements of the method specified in claim 1 are found in the subclaims.

In accordance with one preferred development, the elastic elevation has a first region with a first elastic material and a second region with a second elastic material. The first region adjoins the roof area of the elastic elevation and adjoins the entire first oblique area. Thus, both the conductor track and the contact area are carried by the first region. The second region begins below the first oblique area. The thickness of the second region increases in the direction of the second oblique area. The second region adjoins the second oblique area. The material of the second region is softer than the material of the first region. If a pressure is exerted on the contact region, then in an advantageous manner principally the second region is deformed. The first region essentially maintains its form on account of its higher stiffness. As a result, the conductor track and the contact area are additionally protected against mechanical deformation forces.

In accordance with one preferred development, the basic area of the second region is greater than that of the first region.

In accordance with one preferred development, the elastic material contains silicone.

In accordance with one preferred development, the elastic elevation has a sufficient width, so that a desired number of straight conductor tracks can be guided in a parallel manner onto the highest elevation. This makes it possible to arrange a multiplicity of contacts in a parallel and space-saving manner and to connect them to a component.

In accordance with one preferred development, one or both oblique areas have steps in their surfaces.

In accordance with one preferred development, one or both oblique areas of the elastic elevation have a smooth surface.

In accordance with one preferred development, the carrier is a component. This enables the components to be connected to a conductor track in a manner free of soldering. The fixing may be effected by adhesive bonding, inter alia.

In accordance with one preferred development, the carrier is a printed circuit board. The printed circuit board with the elastic contact-connecting devices may then be e.g. a component for a sensor for an automatic test device.

In accordance with one preferred development, the contact area is a flat contact. In the simplest case, the contact area does not differ from a conductor track. Another development is an elevated contact which is fashioned spherically (see FIG. 7A), in order to keep the contact device compatible with conventional flip-chip techniques, or which has a tip (see FIG. 7B), in order to enable a contact by means of superficial oxide layers of a mating contact.

Further exemplary embodiments of the invention are illustrated in the drawings and are explained in more detail in the description below.

DETAILED DESCRIPTION OF THE INVENTION

In the figures, identical reference systems designate identical or functionally identical constituent parts.

Figure 1:
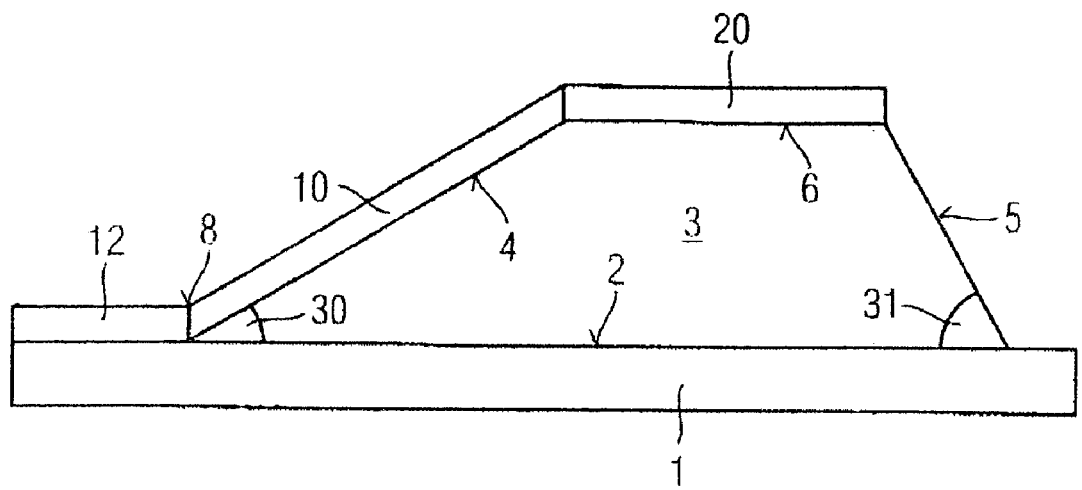
FIG. 1 shows a schematic illustration of a partial section through one embodiment of the present invention.
Figure 6:
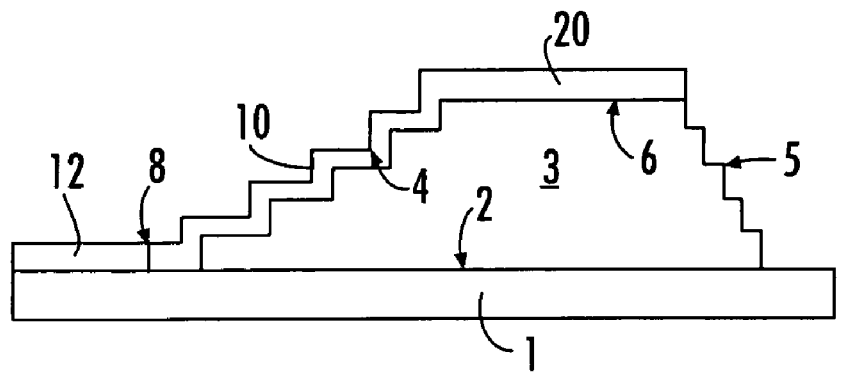
FIGS. 6, 7A and 7B show schematic illustrations of a partial section through alternate embodiments of the present invention.
Figure 7A:
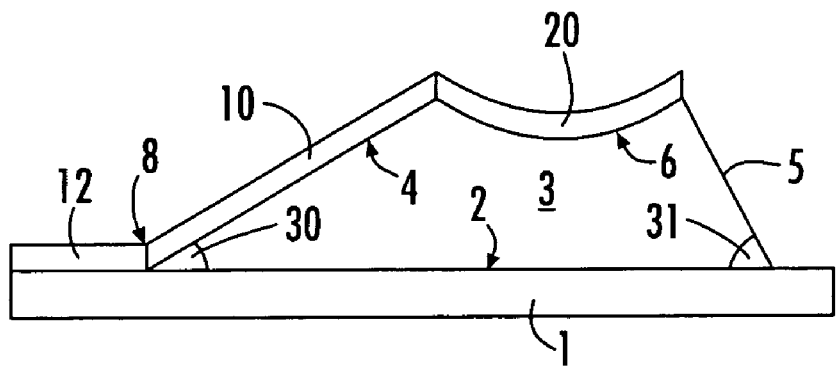
Figure 7B:
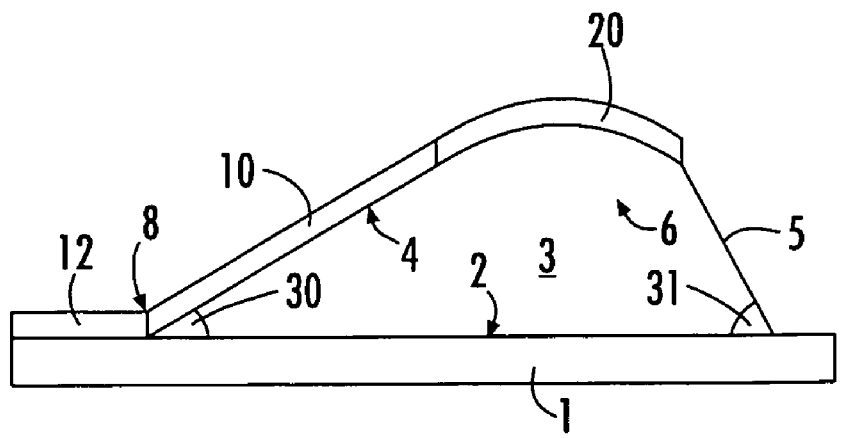

FIG. 1 shows an illustration of a partial section through one embodiment of the present invention. It shows a carrier 1. Possible carriers 1 are a topmost region of a component and/or of a printed circuit board. An elastic elevation 3 is applied to a carrier area 2 of the carrier 1. The elastic elevation 3 is formed from an elastic material; a preferred material is silicone. The elastic elevation has a trapezoidal cross section to the greatest possible extent. A roof area 6 is the parallel area opposite the carrier area 2. Two ramps (or oblique areas) 4, 5 lead up to the roof area 6. The inclination 30 of the ramp 4 relative to the carrier area 2 is shallower than the inclination 31 of the ramp 5. The ramps 4, 5 have a smooth surface. The geometrical descriptions are to be understood analogously. Deviations from the geometrical figure result inter alia from a screen printing method by which the elevations can be produced. In this case, unevennesses arise both in the roof area and in the ramps. In a further embodiment of the present invention, they have a stepped structure (see FIG. 6). In a production method, for this purpose, one silicone-containing layer after the other is progressively applied to a preceding layer e.g. by means of a screen printing method in order to create the elevation 3. The number and the height of the steps results from the number of printing steps and the desired height of the elevation 3.

A contact region 20 is applied to the roof area 6. This may be configured identically to a conductor track 10, may be a spherical metal body or may have some other typical design of a contact. The contact region 20 is connected to corresponding structures on the carrier 1 by means of a conductor track 10. The conductor track 10 is guided over the shallower ramp 4 onto the roof area 6. A typical material for the conductor track is a layer construction comprising copper, nickel thereon and gold thereon.

In order to connect the contact region 20 to another printed circuit board or another component, a mating contact is pressed onto the contact region 20, so that the elastic elevation 3 is pressed together along the vertical. The deformation results in a restoring force that presses the contact region 20 against the mating contact. A mechanical connection of the contact region 20 to the mating contact is thus ensured, and an electrical connection is thus achieved at the same time.

The pressing-on of the mating contact reduces the height of the elevation. The consequence of this is that the elastic material of the elevation 3 yields laterally. In this case, it is apparent in an advantageous manner that the material yields principally toward the steeper ramp 5, and toward the shallow ramp 4 only to a small extent.

This is apparent in the fact that the ramp 5 bulges out convexly, whereas the shallower ramp 4 maintains its form to the greatest possible extent. Therefore, in an advantageous manner, only small or no deformation forces act on the conductor track 10.

The conductor track 10 typically has materials that exhibit only little ductility. Therefore, the conductor track 10 can be pressed together only with difficulty. The conductor track 10 rather tends to yield to the compression and to maintain its length. The conductor track 10 detaches from the ramp 4 in this case. For lack of mechanical support, a conductor track 10 released from the elevation 3 would disadvantageously incur irreparable damage over time. The effect of the compression forces on the conductor track 10 during contact-connection is distributed over the entire length of the conductor track 10. In this case, it is advantageous that the length of the conductor track on the shallow ramp 4 is greater than it would be if it were guided over a steeper ramp. It emerges from this that the compression force per section of length is lower in the case where the conductor track 10 is guided over the ramp 4, and, consequently, the conductor track 10 typically does not exhibit any tendency toward being detached from the ramp 4.

Figure 2:
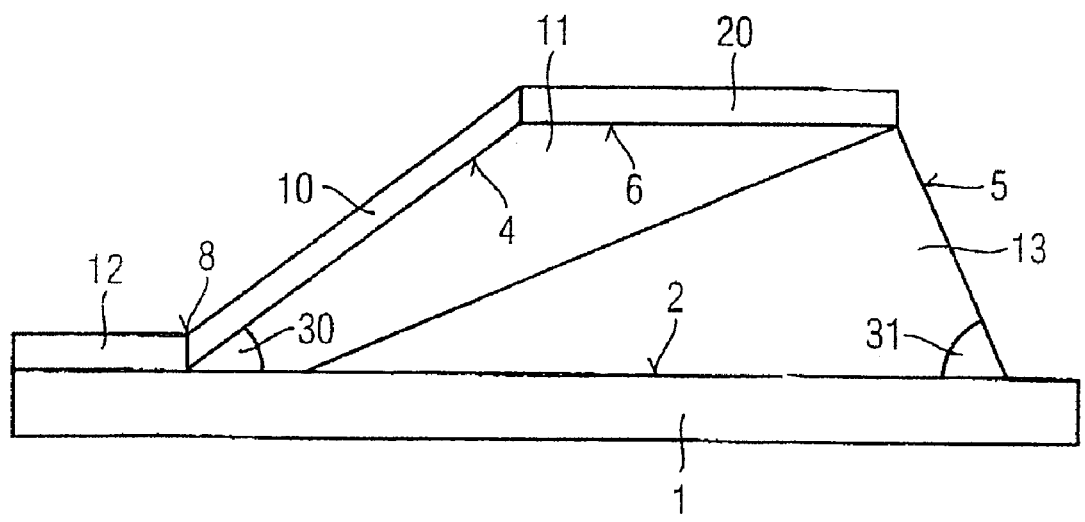
FIG. 2 shows a schematic illustration of a partial section through a further embodiment of the present invention.

FIG. 2 shows an illustration of a partial section through a second embodiment of the present invention. Analogously to FIG. 1, an elastic elevation 3 is applied to a carrier 1. The elastic elevation is subdivided into two regions, a stiffening region 11 and soft region 13. The stiffening region 11 is composed of a material which, although it is elastic, is stiffer than the material of the soft elastic region 13. The stiffening region 11 is a contiguous region and includes all the regions that are situated directly below the conductor track 10 and the contact region 20. The stiffening region 11 is applied in the region of the base point 8 of the shallow ramp 4 on the carrier area 2. Otherwise, the stiffening region 11 is applied to the soft region 13, the height of the soft region increasing in the direction of the steep ramp 5. If a force is exerted on the contact region 20, principally the region 13 made of the softer elastic material is deformed. The stiffening region 11 additionally supports the effect that the shallower ramp 4 is not deformed. In an advantageous manner, the deformation forces acting on the conductor track 10 are thereby reduced further. The compression forces acting on the conductor track 10 are also attenuated by the stiffening region 11. It can be assumed as a simplification that the entire conductor track 10 now rotates about the base point 8 of the shallower ramp 4. The advantage of this embodiment is that virtually no forces act on the conductor track 10 on the shallow ramp 4. The conductor track 10 thus becomes more resistant toward repeated contact-connection by a mating contact being pressed onto the contact region 20.

In a further embodiment (not illustrated), the stiffening region 11 does not begin at the base point of the ramp 4, but rather only above the carrier area 2. What is advantageous about this embodiment is that the flexure of the ramp 4 does not take place in point-type fashion at the base point 8, but rather has a larger radius of curvature. This means that the conductor track 10 is loaded to a lesser extent by the flexure in the region of the base point 8.

Figure 3:
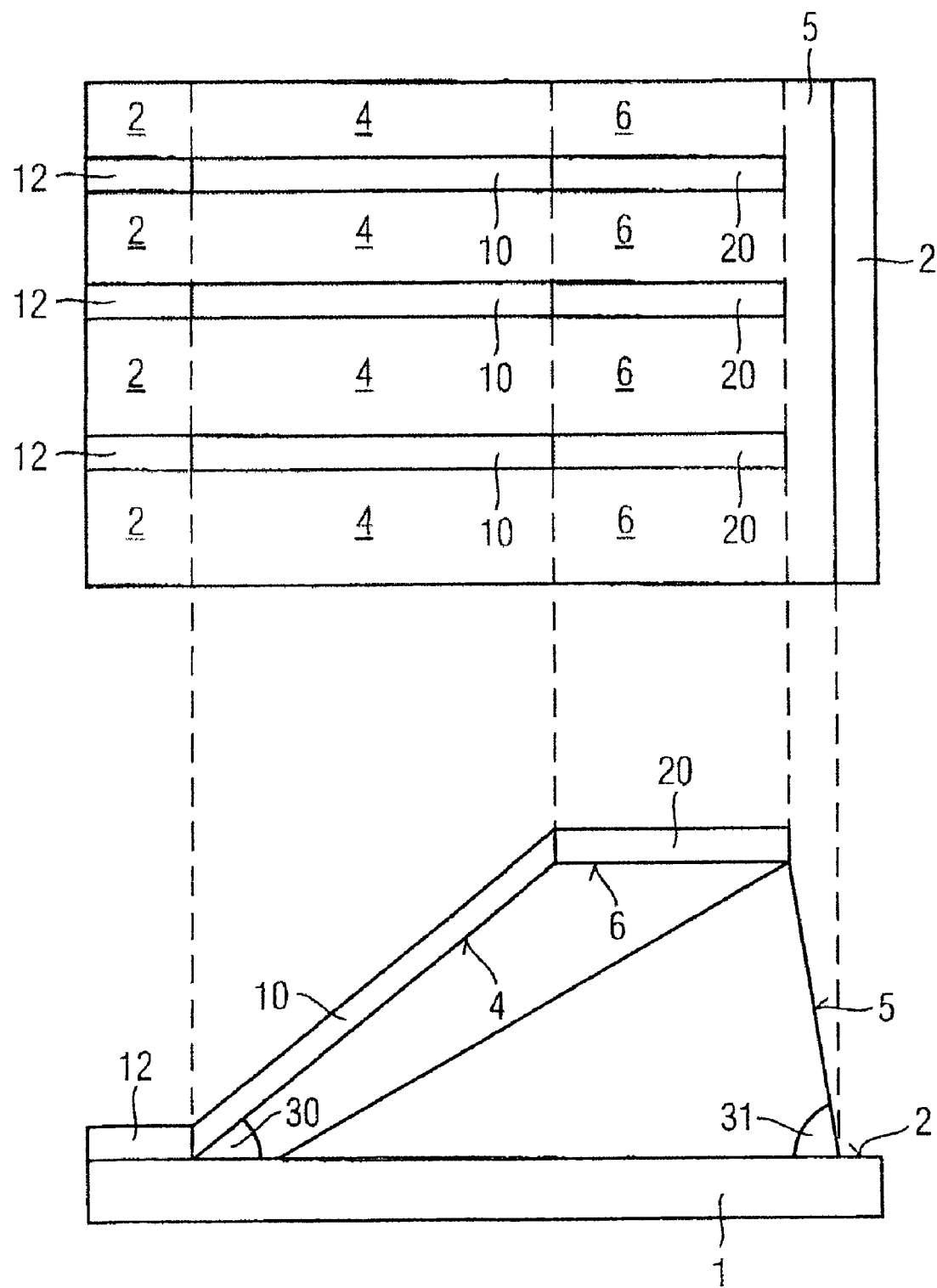
FIG. 3 shows a schematic illustration of a plan view of and a partial section through a further embodiment of the present invention.

FIG. 3 shows a partial section through and a plan view of a further embodiment of the present invention. The cross section corresponds to FIG. 2. The plan view shows a plurality of conductor tracks 10 that are guided parallel to one another. These conductor tracks 10 all lead up rectilinearly to a ram part provided by the elastic elevation 3. There is a need to connect conductor tracks 10 to many contact regions 20 that lie close together. The simplest arrangement of the conductor tracks 10 is to lead them to the contact regions 20 in a parallel manner. However, in the case of previous elastic contact-connections, it has typically been necessary to lead the conductor tracks 10 up to the ram part on lengthened tracks e.g. in zigzag or meandering fashion since, in the previous structures, excessively large compression and transverse forces acted on the conductor tracks 10 during contact-connection and could only be absorbed by the lengthened tracks of the conductor tracks. By virtue of the embodiment of the present invention, the forces act principally on the steeper ramp 5 and not on the ramp 4 and the conductor tracks 10 situated thereon. This enables the conductor tracks to be guided in a straight fashion, which is advantageous with regard to the simplicity and the space requirement of a conductor track.

Figure 4:
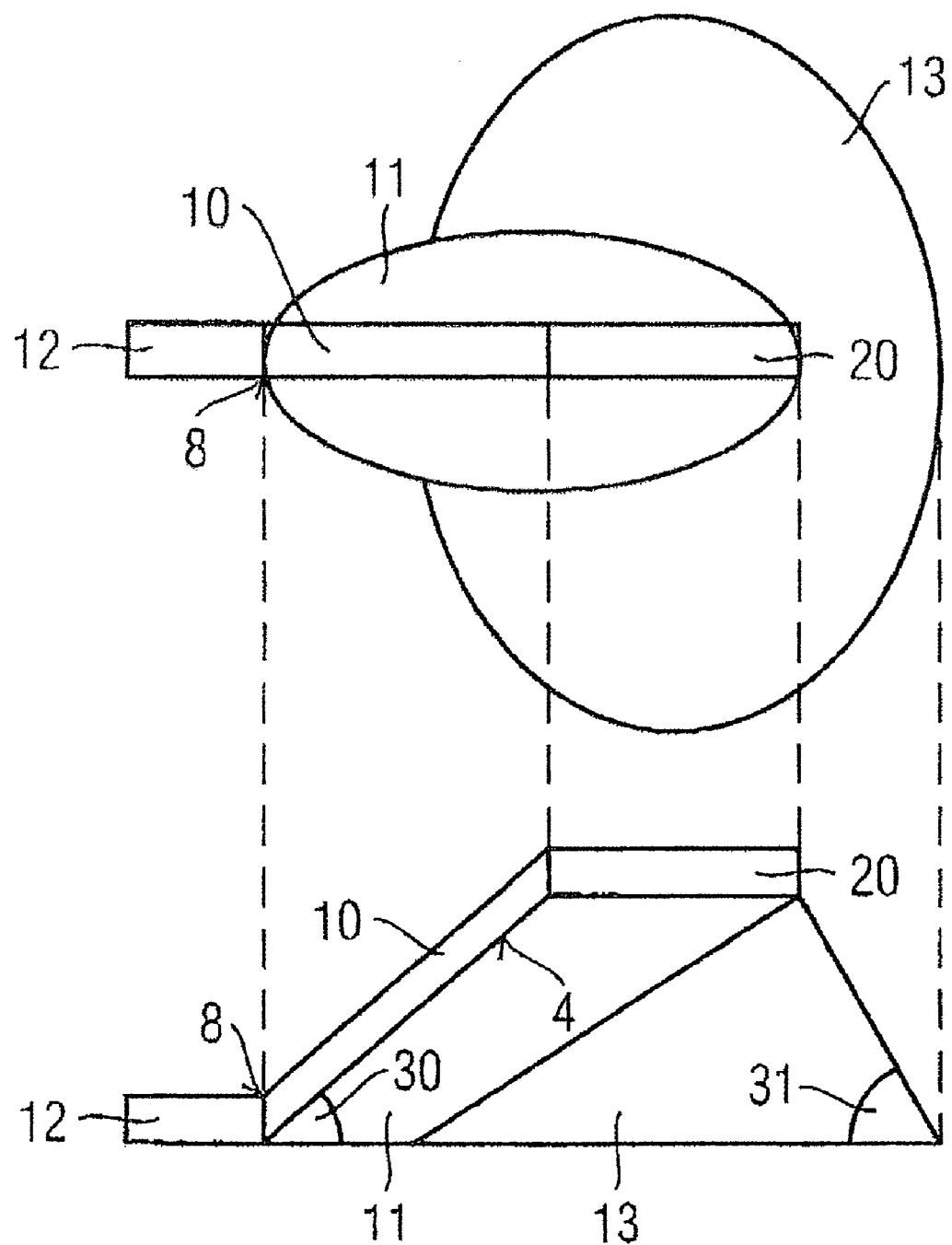
FIG. 4 shows a schematic illustration of a plan view of and a partial section through a further embodiment of the present invention.
Figure 5A:
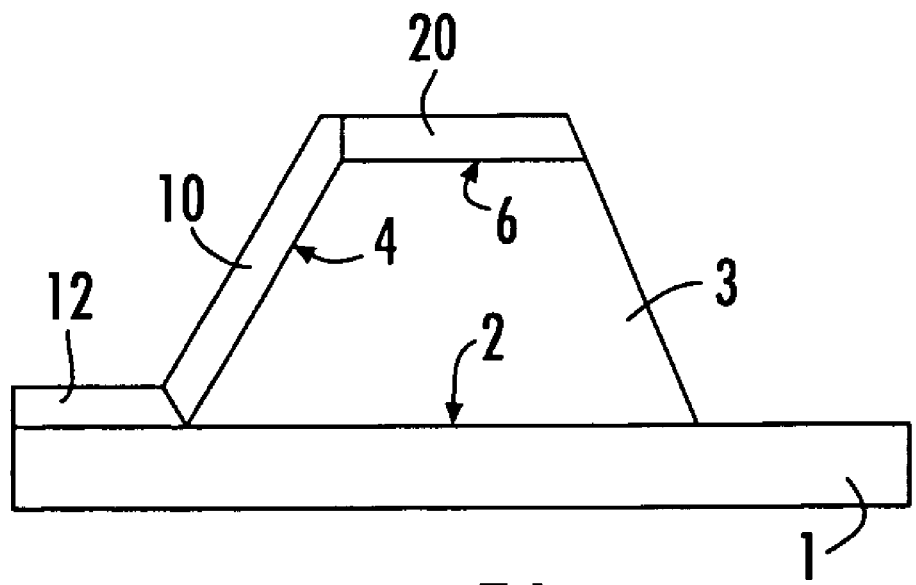
FIGS. 5a, b show two schematic illustrations for elucidating by way of example a basic problem area of elastic contact-connections.
Figure 5B:
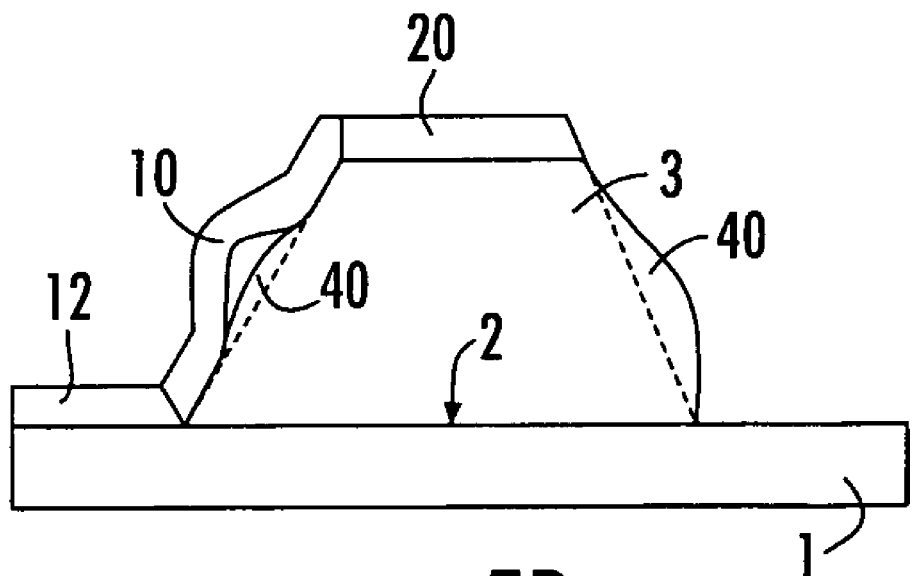

FIG. 4 shows a schematic illustration of a cross section through and a plan view of a further embodiment of the present invention. The cross section is identical to that of FIGS. 2 and 3. The elastic elevation 3 is once again composed of the stiffening 11 and the region 13 made of the softer elastic material. The soft region 13 has a first bearing area. The stiffening 11 is deposited onto the first bearing area. The cross-sectional area of the stiffening 11 has a smaller width than the cross-sectional area of the first bearing area, so that the softer region 13 can for the most part be applied on the first bearing area. In the embodiment illustrated, the stiffening 11 touches the carrier area 2 at the base point 8 of the shallower ramp 4. The conductor track 10 can thus be guided exclusively on the stiffening 11 up to the roof area 6 of the elastic elevation 3. In the region of the base point 8, the stiffening is applied to the carrier area 2. The conductor track 10 is thus carried by the stiffening over its entire length and protected against mechanical stress. In an embodiment that is not illustrated, the stiffening 11 does not touch the carrier area 2 and, consequently, the conductor track 10 is not guided on the stiffening 11 for a first section.

Although the present invention has been described above on the basis of a preferred exemplary embodiment, it is not restricted thereto, but rather can be modified in diverse ways.

The previous exemplary embodiments suggest that the elevation is made of insulating material. In this case, it is also conceivable to form the elastic elevation from conductive polymers, and if not the entire elevation then at least the stiffening region.

LIST OF REFERENCE SYMBOLS

1 Carrier
2 Carrier area 1
3 Elastic elevation
4 Oblique area having low inclination
5 Oblique area having high inclination
6 Roof area
8 Base point of the oblique area 8 4
10 Conductor track
11 Stiffening
12 Structure on the carrier 1
13 Soft region
20 Contact area
30 Angle of inclination of the oblique area 4
31 Angle of inclination of the oblique area 5
40 Bulged region

What is claimed is:

1. Flexible contact-connection device for electrical contact-connection of components, having:
   (a) an elastic elevation on a carrier, the elastic elevation having a roof area, a first oblique area having a first inclination with respect to a surface of the carrier and a second oblique area having a second inclination with respect to the surface of the carrier, the first inclination being less than the second inclination;
   (b) one or more contact regions applied on the roof area of the elastic elevation, and
   (c) one or more conductor tracks, which are electrically connected to the one or more contact regions and are guided onto the carrier over the first oblique area, the elastic elevation having:
      (i) a first region made of a first elastic material having a first stiffness, the first region adjoining the roof area and the area of the first oblique area; and
      (ii) a second region made of a second elastic material having a second stiffness, the second region beginning below the first oblique area, becoming increasingly thicker in the direction of the second oblique area and adjoining the second oblique area, the first stiffness of the first material being greater than the second stiffness of the second material.

2. Contact-connection device according to claim 1, a basic area of the second region being greater than a basic area of the first region.

3. Contact-connection device according to claim 1, the first second elastic materials containing silicone.

4. Contact-connection device according to claim 1, the elastic elevation having a sufficient width, so that a desired number of straight conductor tracks can be guided in a parallel manner onto the highest elevation.

5. Contact-connection device according to claim 1, one or both oblique areas having a stepped structure.

6. Contact-connection device according to claim 1, one or both oblique areas having a smooth surface.

7. Contact-connection device according to claim 1, the carrier being a component.

8. Contact-connection device according to claim 1, the carrier being a printed circuit board.

9. Contact-connection device according to claim 1, the contact region being a flat contact or an elevated contact.

10. Contact-connection device according to claim 9, the elevated contact being spherical or provided with a tip.

* * * * *